United States Patent
Kim et al.

(10) Patent No.: US 10,067,208 B2
(45) Date of Patent: Sep. 4, 2018

(54) SYSTEMS AND METHODS FOR VIRTUAL FREQUENCY SELECTIVE INVERSION IN MAGNETIC RESONANCE

(71) Applicant: Duke University, Durham, NC (US)

(72) Inventors: Raymond J. Kim, Chapel Hill, NC (US); Elizabeth R. Jenista, Durham, NC (US); Han W. Kim, Raleigh, NC (US); Enn-Ling Chen, Chapel Hill, NC (US)

(73) Assignee: Duke University, Durham, NC (US)

( * ) Notice: Subject to any disclaimer, the term of this patent is extended or adjusted under 35 U.S.C. 154(b) by 1070 days.

(21) Appl. No.: 14/373,895

(22) PCT Filed: Nov. 14, 2012

(86) PCT No.: PCT/US2012/065134
§ 371 (c)(1),
(2) Date: Jul. 22, 2014

(87) PCT Pub. No.: WO2013/115882
PCT Pub. Date: Aug. 8, 2013

(65) Prior Publication Data
US 2015/0077106 A1   Mar. 19, 2015

Related U.S. Application Data

(60) Provisional application No. 61/593,536, filed on Feb. 1, 2012.

(51) Int. Cl.
*G01V 3/00* (2006.01)
*G01R 33/483* (2006.01)
(Continued)

(52) U.S. Cl.
CPC ....... *G01R 33/483* (2013.01); *G01R 33/3607* (2013.01); *G01R 33/4616* (2013.01);
(Continued)

(58) Field of Classification Search
CPC ..................................................... G01R 33/50
(Continued)

(56) References Cited

U.S. PATENT DOCUMENTS

| 5,537,039 A * | 7/1996 | Le Roux | G01R 33/4822 |
| | | | 324/307 |
| 8,710,840 B2 * | 4/2014 | Gross | G01R 33/565 |
| | | | 324/309 |

(Continued)

*Primary Examiner* — Louis Arana
(74) *Attorney, Agent, or Firm* — Olive Law Group, PLLC

(57) ABSTRACT

Magnetic resonance imaging (MRI) acquisition and reconstruction techniques that invert MR signals of selected frequencies without the application of inversion RF pulses are disclosed. An example method comprises acquisition of at least one MR image representative dataset and an associated phase reference dataset, and classifies anatomical material into a first component representing anatomical material having a first range of resonance frequencies associated with a first range of phase differences between the MR image representative dataset and the reference image dataset and a second component representing anatomical material having a second range of resonance frequencies associated with a second range of phase differences between the MR image representative dataset and the reference image dataset. The method assigns different visual attributes to first and second components derived using phase differences between the MR image representative dataset and the reference image dataset and displays an image.

20 Claims, 12 Drawing Sheets

(51) Int. Cl.
  *G01R 33/50* (2006.01)
  *G01R 33/48* (2006.01)
  *G01R 33/36* (2006.01)
  *G01R 33/46* (2006.01)
  *G06T 11/00* (2006.01)
  *G01R 33/56* (2006.01)

(52) U.S. Cl.
  CPC ......... *G01R 33/4828* (2013.01); *G01R 33/50* (2013.01); *G06T 11/006* (2013.01); *G01R 33/5601* (2013.01)

(58) Field of Classification Search
  USPC .......................................... 324/307, 309, 314
  See application file for complete search history.

(56) References Cited

U.S. PATENT DOCUMENTS

| | | | |
|---|---|---|---|
| 9,256,977 B2* | 2/2016 | Rehwald | G01R 33/4828 |
| 2004/0169512 A1* | 9/2004 | Jara | G01R 33/50 |
| | | | 324/309 |
| 2011/0274331 A1* | 11/2011 | Weng | G01R 33/4824 |
| | | | 382/131 |
| 2015/0077106 A1* | 3/2015 | Kim | G01R 33/4828 |
| | | | 324/309 |

\* cited by examiner

SYSTEMS AND METHODS FOR VIRTUAL FREQUENCY SELECTIVE INVERSION IN MAGNETIC RESONANCE

CROSS REFERENCE TO RELATED APPLICATION

This application is a 35 U.S.C. 371 application of PCT International Patent Application Number PCT/US2012/065134, filed Nov. 14, 2012, which claims the benefit of U.S. Provisional Patent Application No. 61/593,536, filed Feb. 1, 2012; the disclosures of which are incorporated herein by reference in their entireties.

TECHNICAL FIELD

The present disclosure relates to a system for acquiring and reconstructing MRI datasets employing a method referred to as virtual frequency selective inversion (VFSI) which separates components representing anatomical material having different ranges of resonance frequencies associated with different ranges of phases between an anatomical MR image representative dataset and an associated reference image dataset.

BACKGROUND

The image luminance contrast (difference in luminance) generated in an MR image is controllable by the application of radio-frequency (RF) pulses. One class of RF pulse is the inversion recovery (IR) pulse which tips the equilibrium magnetization aligned along the main magnetic field (+z direction) to the −z direction. IR pulses have been used to produce $T_1$ weighting, allowing for the differentiation of tissues based on their $T_1$ values. A specific example of this application of IR pulses is known as delayed-enhancement MRI (and also known as late gadolinium-enhancement [LGE] imaging), which enhances the image luminance contrast between normal and infarcted (or scarred) myocardium. A known variant of delayed-enhancement imaging is called phase sensitive inversion recovery (PSIR) imaging which acquires T1-weighted inversion recovery images and reconstructs them with a phase sensitive reconstruction. With PSIR reconstruction, the sign of the magnetization in the anatomical MR image is retained, causing the image luminance contrast between normal and infarcted myocardium to be less sensitive to the inversion time (TI) used.

A known PSIR data acquisition is shown in FIG. 1. A non-selective IR pulse 203 causes magnetization 205 to rotate from the +z-axis to the −z-axis. An anatomical dataset acquisition at time 207 is followed by a reference dataset acquisition at time 209 being acquired without a preceding IR pulse at a later time, about TR after the anatomical dataset acquisition (for example one heartbeat later). A resulting PSIR image is obtained by correcting the phase of the anatomical dataset by using the phase of the reference dataset. In the resulting phase corrected anatomical image, the image intensity scale is automatically adjusted such that the smallest signal which is typically zero or negative appears black, and the most positive appears bright.

Fat suppression in MRI is used to ensure high quality images in regions with significant fat content. A variety of fat suppression methods are known. Frequency selective saturation pulses can be used to selectively suppress fat signal. One known example is a chemical shift selective (CHESS) method in which a saturation pulse is played at the fat resonance frequency followed by a spoiling gradient to destroy fat magnetization. While this method is effective for spectroscopy applications, the data acquisition time typically required for clinical imaging (approximately 100-300 ms) is so long that a large amount of the fat magnetization has recovered from the saturation pulse resulting in poor fat suppression capability.

Another known method of fat suppression is the short tau inversion recovery (STIR) pulse sequence. This method is used in connection with turbo-spin echo (TSE) readout and dark-blood (DB) preparation. A non-frequency selective but usually spatially-selective IR (NFSIR) pulse is timed to null fat signal at the beginning of the TSE readout and not the center of k-space. STIR suppresses fat signal well due to the nature of the TSE readout. The first pulse of a TSE readout train is a 90 degrees pulse that "locks in" the nulled fat signal. In response to the pulse, the longitudinal relaxation of fat is irrelevant for the remainder of the readout. Gradient echo (GRE, Siemens proprietary name Flash, fast low angle shot) and steady state free precession (SSFP, Siemens proprietary name TrueFisp, true fast imaging with steady precession) readouts do not have this "lock-in" property and thus require different timing between an NFSIR (Non-frequency Selective Inversion recovery) pulse and the beginning of the dataset acquisition. Such timing restricts the maximum number of lines in a dataset that can be acquired after an NFSIR pulse, often below a clinically useful value. Thus, in practice the STIR sequence works best in combination with TSE readout. Furthermore, STIR works only with a single inversion time which is used to null fat signal. It is substantially not feasible to apply an additional non-frequency selective IR pulse to impart T1-contrast, as the application of both pulses unfavorably alters image luminance contrast and prevents suppression of fat signal. In addition, to avoid image artifacts dark blood (DB) preparation is required to be used with TSE readout and consequently with the STIR method. DB preparation needs to be used in the absence of contrast agent due to timing limitations. Therefore, STIR may only be used without contrast agent.

Another known method of fat suppression method, known SPAIR (Spectral Selection Attenuated Inversion Recovery) or known SPIR (Spectral Presaturation Inversion Recovery) pulse provide fat suppression. These methods work in a similar way to STIR with a difference being that a non-frequency selective IR pulse is replaced by a SPAIR or a SPIR pulse. Both pulses are fat-frequency selective and spatially non-selective. The problems are similar to those of STIR, but both pulses can be used as a fat-frequency selective inversion pulse.

In addition to the frequency selective methods described above, another class of known fat suppression methods recognizes that due to the differences in frequency between fat and water, their signals will go in and out of phase. The classic application of this is the Dixon method. By acquiring two images with different echo times (TEs), one where water and fat are in phase and another where they are out of phase, the Dixon method allows the user to add or subtract the images to create water or fat only images. A limitation of this method is that the quality of the fat suppression is highly sensitive to inhomogeneity in the static magnetic field B0. In order to overcome this sensitivity to magnetic field inhomogeneity, often several (more than 2) images are acquired with different TEs, increasing scan time, the specific absorption rate (SAR, the rate at which RF energy is absorbed) and reconstruction time.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

A method for acquiring and reconstructing magnetic resonance imaging (MRI) data is described in which MR signal of selected frequencies are inverted without the application of inversion RF pulses. The method referred to as virtual frequency selective inversion (VFSI) uses interleaved acquisitions with different echo times, and a phase sensitive reconstruction. The method includes acquiring at least one MR image representative dataset and an associated phase reference dataset and deriving from the at least one MR image representative dataset and the associated phase reference dataset, a first component and a second component. The first component represents anatomical material having a first range of resonance frequencies associated with a first range of phase differences between the MR image representative dataset and the associated phase reference dataset. The second component represents anatomical material having a second range of resonance frequencies associated with a second range of phase differences between the MR image representative dataset and the associated phase reference dataset. Different visual attributes are assigned to the derived first and second components and an image is displayed. The image comprises at least one of (a), the derived first component (b) the derived second component, (c) a composite of the derived first and second components, and (d) a composite of the MR image representative dataset and at least one of the first and second derived components.

BRIEF DESCRIPTION OF THE DRAWINGS

The foregoing summary, as well as the following detailed description of various embodiments, is better understood when read in conjunction with the appended drawings. For the purposes of illustration, there is shown in the drawings exemplary embodiments; however, the presently disclosed subject matter is not limited to the specific methods and instrumentalities disclosed. In the drawings.

DETAILED DESCRIPTION

The presently disclosed subject matter is described with specificity to meet statutory requirements. However, the description itself is not intended to limit the scope of this patent. Rather, the inventors have contemplated that the claimed subject matter might also be embodied in other ways, to include different steps or elements similar to the ones described in this document, in conjunction with other present or future technologies. Moreover, although the term "step" may be used herein to connote different aspects of methods employed, the term should not be interpreted as implying any particular order among or between various steps herein disclosed unless and except when the order of individual steps is explicitly described.

A magnetic resonance imaging (MRI) acquisition and reconstruction method which produces the equivalent of inverting MR signal of selected frequencies without the application of inversion RF pulses for this purpose, using interleaved acquisitions with different echo times, and a phase sensitive reconstruction. This method is advantageously usable in place of frequency selective inversion RF pulses to achieve similar relative change in phase whilst reducing the number of RF pulses needed, reducing the power deposition and increasing the signal-to-noise of the image acquired.

The inventors have advantageously determined that the effect of an inversion pulse is achievable without using IR pulses. A system in accordance with the present disclosure advantageously achieves the effect of an inversion without playing an IR pulse. The system reduces inherent pulse imperfections occurring with an RF pulse resulting in inhomogeneity in the inverted magnetization and signal loss. The system avoids the application of additional RF pulses and provides a resulting boost in signal-to-noise (SNR). Further, the system reduces the typically relatively large amount of power otherwise needed for IR pulses which contributes significantly to patient specific absorption rate (SAR, the rate at which RF energy is absorbed). This can become problematic for patient imaging, especially at higher magnetic fields (>1.5 Tesla) where higher peak RF power is required for IR pulses.

Figure 1:
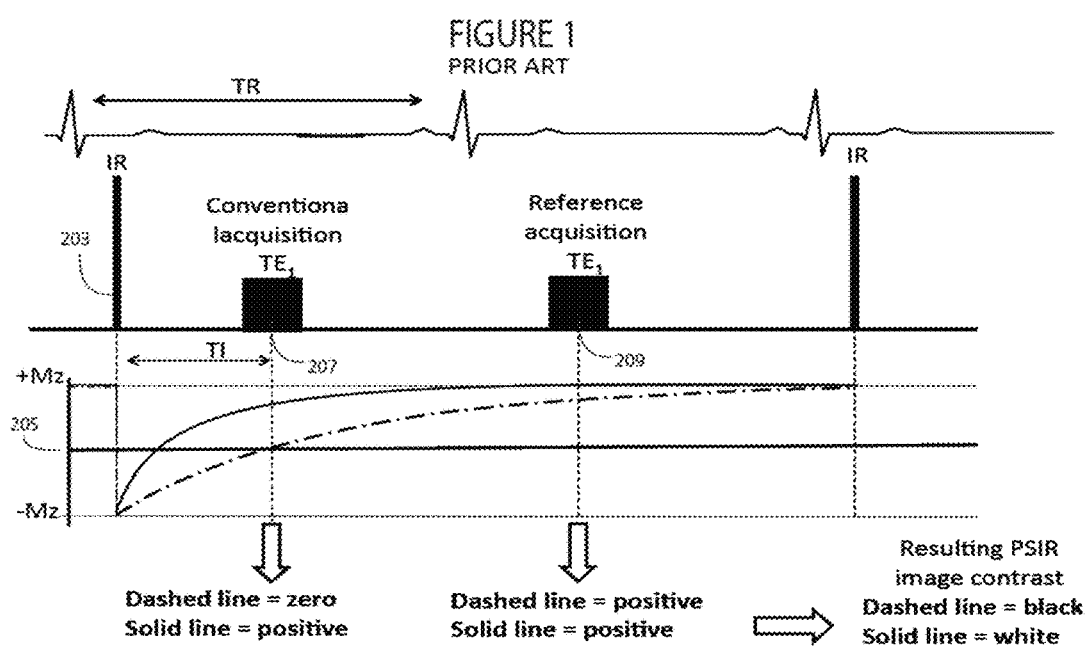
FIG. 1 shows a known phase sensitive inversion recovery (PSIR) imaging pulse sequence.
Figure 2:
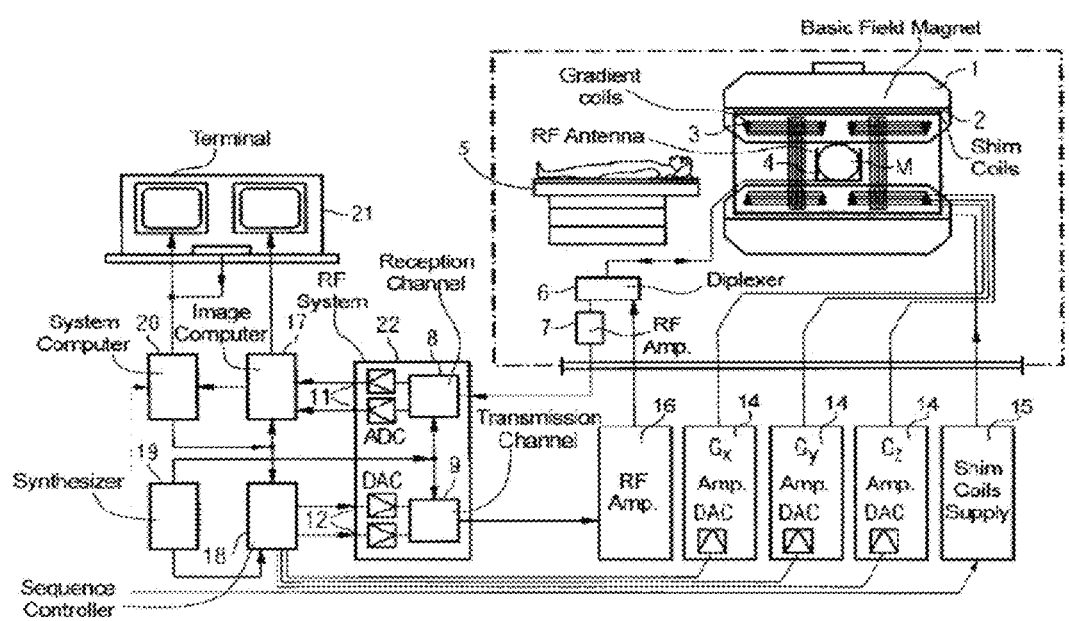
FIG. 2 shows a system for acquiring and processing MRI data employing virtual frequency selective inversion (VFSI) according to embodiments of the present disclosure.

FIG. 2 shows system 10 for processing MRI data employing virtual frequency selective inversion. In the basic field magnet 1, a cylinder-shaped gradient coil system comprising magnetic field gradient generator 3 is used, which consists of three windings, for example. Each winding is supplied with current by an amplifier 14 in order to generate a linear gradient field in the respective directions of the Cartesian coordinate system. The first winding of the gradient field system 3 generates a gradient $G_x$ in the x-direction, the second winding generates a gradient $G_y$ in the y-direction, and the third winding generates a gradient $G_z$ in the z-direction. Each amplifier 14 contains a digital-analog converter, which is controlled by a sequence controller 18 for the generation of gradient pulses at proper times. Homogeneity of the base magnetic field B0 is corrected using shim coils 2 electrically powered by shim coil supply 15.

Within the gradient field system 3, radio-frequency (RF) coils comprising RF (Radio Frequency) signal generator 4, are located which converts the radio-frequency pulses emitted by a radio-frequency power amplifier 16 via multiplexer 6 into a magnetic alternating field in order to excite the nuclei and align the nuclear spins of the object to be examined or the region of the object to be examined. In an interleaved embodiment, the RF (Radio Frequency) signal generator generates RF excitation pulses in an anatomical region of interest and enables subsequent acquisition of associated RF echo data. The magnetic field gradient generator generates anatomical slice specific magnetic field gradients for phase encoding and readout RF data acquisition. Imaging computer 17 reconstructs an image from the processed acquired RF echo pulse data.

An interface in imaging computer 17 acquires and receives an anatomical MR image representative dataset and an associated phase reference image representative dataset. Imaging computer 17 derives from the anatomical MR image representative dataset and the associated phase reference dataset, a first component and a second component. The first component represents anatomical material having a first range of resonance frequencies associated with a first range of phase differences between the MR image representative dataset and the associated phase reference dataset. The second component represents anatomical material having a second range of resonance frequencies associated with a second range of phase differences between the MR image representative dataset and the associated phase reference dataset. Computer 17 assigns different visual attributes to the derived first and second components and displays an image. The image comprises at least one of (a), the derived first component (b) the derived second component, (c) a composite of the derived first and second components, and (d) a composite of the MR image representative dataset and at least one of the first and second derived components.

Figure 3:
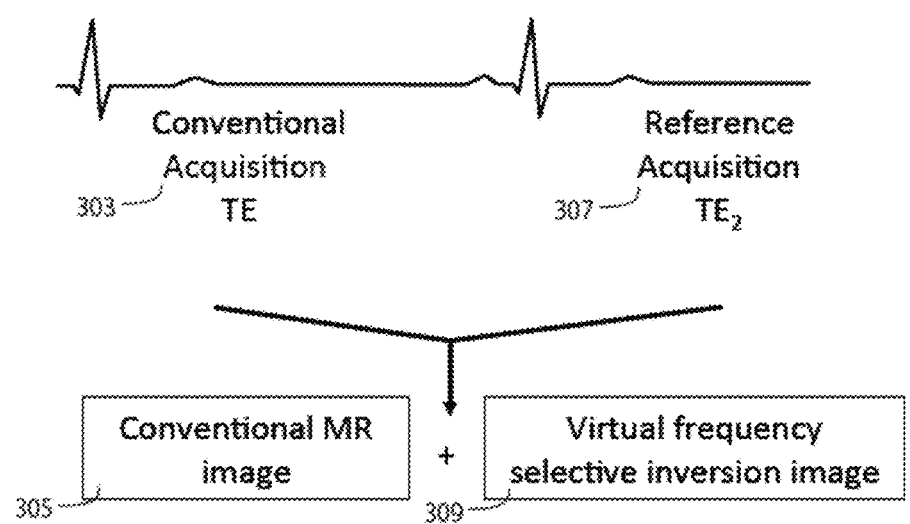
FIG. 3 shows acquisition of a minimum of two image datasets that are combined to create two or more final images in which one chemical species appears to be inverted without the application of an inversion pulse according to embodiments of the present disclosure.

FIG. 3 shows acquisition of a minimum of two image datasets that are combined to create two or more final images in which one chemical species appears to be inverted without the application of an inversion pulse. System 10 (FIG. 2) provides a virtual inversion of a selected frequency MR signal and is referred to as a "virtual frequency selective inversion" (VFSI). System 10 performs an anatomical MR image dataset acquisition 303 and one or more reference image dataset acquisitions 307. The anatomical MR image dataset acquisition 303 may use one of a variety of different MR acquisition methods such as (but not limited to), gradient echo, steady state free precession or turbo spin echo. The MR acquisition 303 may also use a standard magnetization preparation, such as (but not limited to), an inversion pulse for T1-weighting, a T2-preparation pulse sequence for T2-weighting or magnetization transfer. The one or more reference acquisitions 307 use MR acquisition parameters selected to minimally disrupt magnetization, such as a low flip angle or long wait time after acquisition. If there are more than one reference image representative dataset acquisitions, the reference image representative dataset acquisitions use at least one or more echo times different from that of the anatomical MR image representative dataset acquisition. The data from the reference image representative dataset acquisitions and anatomical MR image representative dataset acquisitions are advantageously combined with phase sensitive reconstruction to result in a virtual frequency inversion.

In FIG. 3, system 10 acquires a minimum of datasets including a first anatomical MR image dataset acquisition 303 with a first TE time and a second reference image representative dataset acquisition with a different second TE time. The anatomical MR image representative dataset acquisition 303 uses a standard readout with or without a preparation module providing conventional MR image dataset 305. MR acquisition 303 may use one of multiple different preparation pulse sequences including Inversion Recovery, Saturation-Recovery, T2-preparation, for example. MR acquisition 303 may use one of multiple different readout pulse sequence types including Gradient Echo, turbo-spin echo (TSE) and steady state free precession (SSFP), for example. The reference image representative dataset acquisition 307 is advantageously selected to minimally perturb magnetization without use of magnetization preparation and uses one of a variety of different readout pulse sequence types comprising one of multiple different readout pulse sequence types including Gradient Echo, turbo-spin echo (TSE) and steady state free precession (SSFP), for example, typically with a shallow flip angle, to provide virtual frequency selective inversion image dataset 309. The two image datasets 303, 307 are combined to create two or more final images in which one chemical species appears to be inverted without the application of an inversion pulse.

Figure 4:
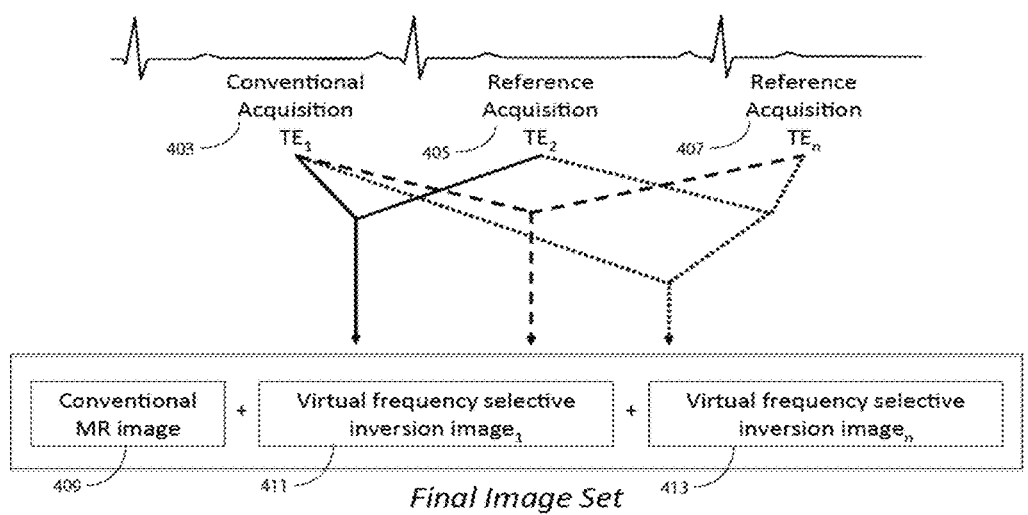
FIG. 4 shows acquisition of a selectable number of reference image dataset scans to achieve a desired contrast and provide a selectable number of virtual frequency selective inversions according to embodiments of the present disclosure.

FIG. 4 shows acquisition of a first conventional MR acquisition 403 with a selectable number of n reference image acquisition scans including reference acquisitions 405 and 407, in this example. System 10 achieves a desired image luminance contrast using a selectable number of virtual frequency selective inversions. System 10 acquires a first conventional MR acquisition 403 with a first TE time, a second reference image dataset acquisition 405 with a different second TE time and an nth reference image dataset acquisition 407 with a different nth TE time. The multiple acquired image datasets 403, 405 and 407 are combined in different combinations to form different images. For example, acquired image datasets 403, 405 are combined to form MR image 409, acquired image datasets 403, 405 are combined to form VFSI image 411 and acquired image datasets 403, 407 are combined to form VFSI image 413.

Figure 5:
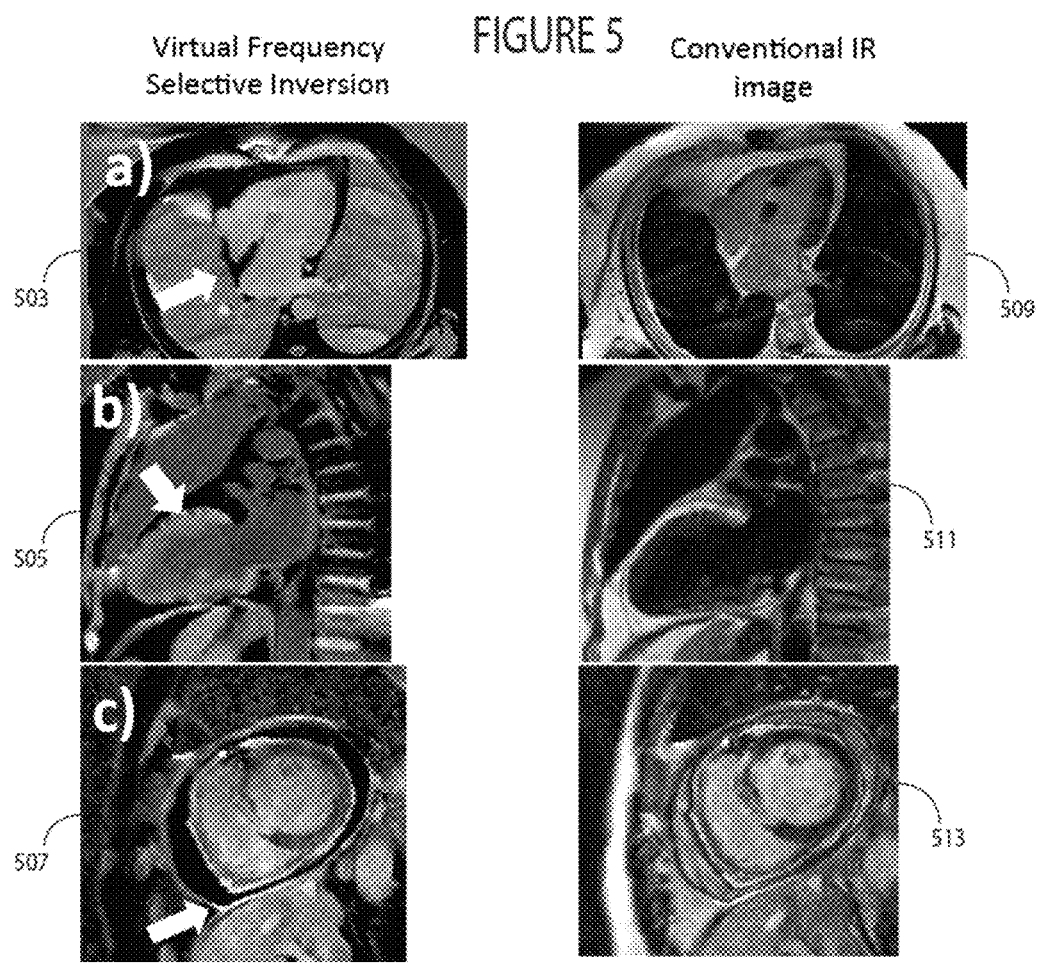
FIG. 5 shows patient medical images acquired using the virtual frequency selective inversion according to embodiments of the present disclosure compared to corresponding images acquired using conventional IR imaging.

FIG. 5 shows patient medical images 503, 505 and 507 acquired using the virtual frequency selective inversion according to embodiments of the present disclosure compared to corresponding images 509, 511 and 513 acquired using conventional IR imaging. In this example, the TE of the reference acquisition is set such that the spins at the fat frequency undergo a 180° shift relative to their phase in the conventional dataset. Other applications, such as those used in combination with contrast agents that cause a shift in resonance frequency, are also usable with the system. System 10 provides images with improved luminance contrast of features identified by white arrows. The images include image 503 of lipomatous hypertrophy of interatrial septum, which appears black on VFSI image, image 505 shows ARVD (Arrhythmogenic Right Ventricular Dysplasia), where the fatty infiltration of the myocardium is more clearly visualized on the VFSI image (505) versus the conventional IR image (511) due to black fat and image 507 shows hyper-enhancement of the myocardium in a patient with pericarditis illustrating the advantage of black fluid for easy identification provided by system 10.

Figure 6:
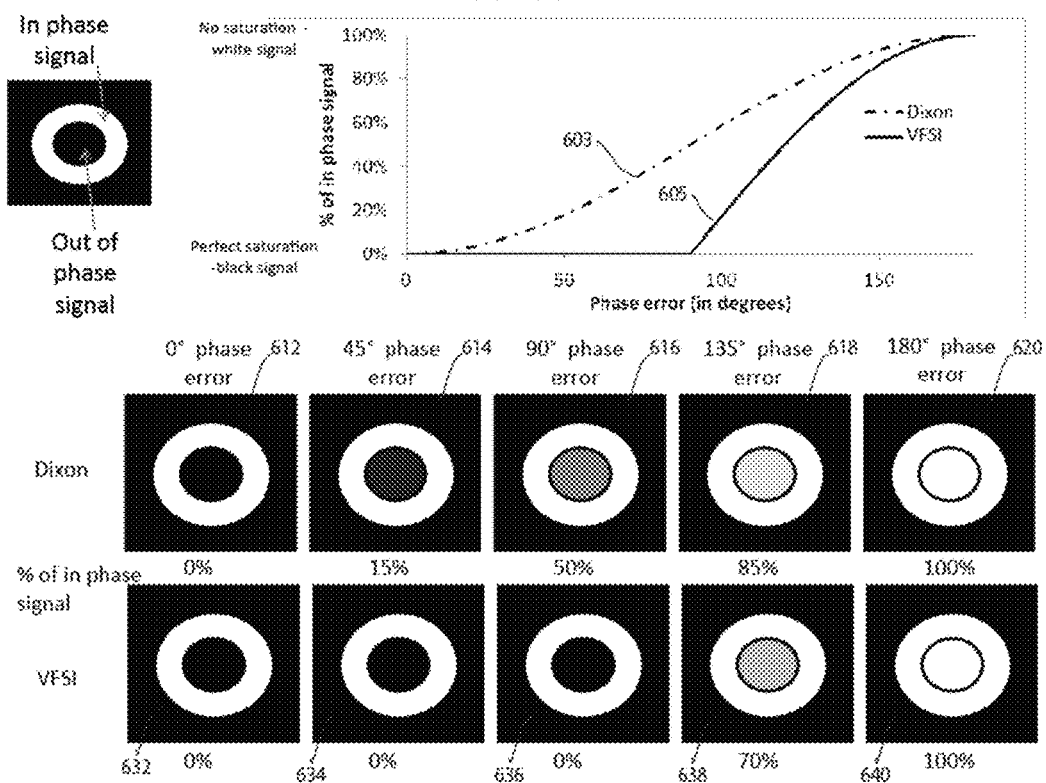
FIG. 6 shows simulated phase signal differences of Dixon and VFSI methods and simulated images illustrating the insensitivity of VFSI to magnetic field inhomogeneity according to embodiments of the present disclosure.

FIG. 6 shows simulated phase signal differences of Dixon and VFSI methods and simulated images illustrating the insensitivity of VFSI to magnetic field inhomogeneity. The VFSI system 10 is insensitive towards phase errors of up to 90 degrees due to the dynamic image intensity scale of a PSIR reconstruction and is a significant improvement over Dixon based methods. Curves 603 and 605 show percentage of in phase MR signal acquired over 180 degrees of phase error for Dixon and VFSI methods respectively. Curve 605 shows the VFSI method advantageously eliminates in phase signal for phase errors over a 0-90 degrees range and offers substantial improvement over this range and the 90-180 degree range compared to the Dixon based method curve 603. The in phase signal is pictorially illustrated for a Dixon method in images 612, 614, 616, 618 and 620 obtained for phase error angles of 0, 45, 90, 135, 180 degrees respectively. The in phase signal is pictorially illustrated for a VFSI method in images 632, 634, 636, 638 and 640 obtained for phase error angles of 0, 45, 90, 135, 180 degrees respectively. It can be seen that the in phase signal for the VFSI method is zero over a 0-90 degree phase error range as shown by images 632, 634 and 636. Further the in phase signal is reduced compared to the Dixon method over the 90-180 degree phase error range as indicated by image 638.

The system is distinct from PSIR imaging in multiple ways. For instance, PSIR imaging is an inversion-recovery method, requiring an IR pulse followed by an appropriate delay time after the IR pulse, whereas system 10 achieves the effect of a frequency selective inversion pulse without the need to use an IR pulse. Another difference is that with PSIR imaging, the TE times of a conventional image dataset acquisition and a subsequent reference image dataset are the same. However, in system 10, the TE of a conventional image dataset acquisition and at least one subsequent reference image dataset are different. A further difference is that in one embodiment, system 10 combines acquired image data with PSIR acquired images to provide advantageous tissue luminance contrast such as of fat-suppressed delayed enhancement.

In comparison to a Dixon based method, system 10 advantageously provides reduced sensitivity to inhomogeneity in an MR static magnetic field which causes phase errors. This is because system 10 involves a projection of phase subtracted data rather than a formal complex image calculation. System 10 enables different tissue weighting of a conventional MR acquisition and reference image data acquisitions. In contrast, for Dixon based methods, tissue preparation and weighting is identical for conventional and reference image dataset acquisitions, which constrains image acquisition parameters, SAR, and scan time.

Figure 7:
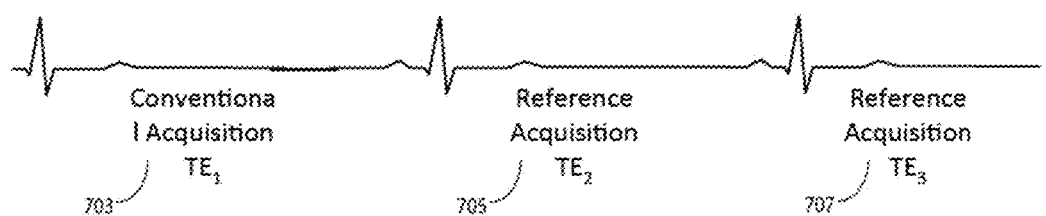
FIG. 7 shows a VFSI acquisition comprising an anatomical MR image dataset and two reference image datasets used to provide a range of different types of image luminance contrast according to embodiments of the present disclosure.

FIG. 7 shows a VFSI acquisition comprising a conventional MR image dataset 703 and two reference image datasets 705 and 707 used to provide a range of different types of image luminance contrast. System 10 adaptively selects and adjusts parameters of reference acquisitions 705 and 707 (for example TE) as well as a preparation module used with conventional acquisition 703 to provide a wide range of different types of image luminance contrast. Acquisition of conventional MR image dataset 703 uses a first TE and a standard readout comprising one of multiple different readout pulse sequence types including Gradient Echo, turbo-spin echo (TSE) and steady state free precession (SSFP), with a preparation module comprising one of an Inversion Recovery, Saturation-Recovery and T2-preparation, pulse sequence for example. Reference acquisitions 705 and 707 employ different TE times that are also different to the conventional dataset acquisition TE time. The reference acquisitions 705 and 707 do not use magnetization preparation and use one of a variety of different readout pulse sequence types comprising one of multiple different readout pulse sequence types including Gradient Echo, turbo-spin echo (TSE) and steady state free precession (SSFP), for example, typically with a shallow flip angle, to provide a virtual frequency selective inversion image dataset.

System 10 creates a black image intensity for a tissue or fluid species that is the most negative luminance intensity species in an image, accommodating a wide range of phase shifts caused by inhomogeneities in the main magnetic field to appear black. Moreover, the system in one embodiment employs a threshold function that ignores phase changes less than that of the threshold, further reducing the sensitivity to magnetic field inhomogeneity. Additionally, the datasets acquired are reconstructed in multiple combinations to achieve different luminance contrast. For example, system 10 produces conventional delayed enhancement images, fat-suppressed PSIR images, and a merged image where an image of anatomical material associated with a frequency that underwent the virtual inversion is overlaid on a conventional MR image with an independent luminance intensity scale (or different color schema). System 10 employs an increased number of reference image datasets with different TEs (beyond the minimum of 2), providing different reconstruction and display options. Acquisition of one conventional MR image dataset and two reference image datasets provides at least three different possible combinations and associated applications.

Figure 8:
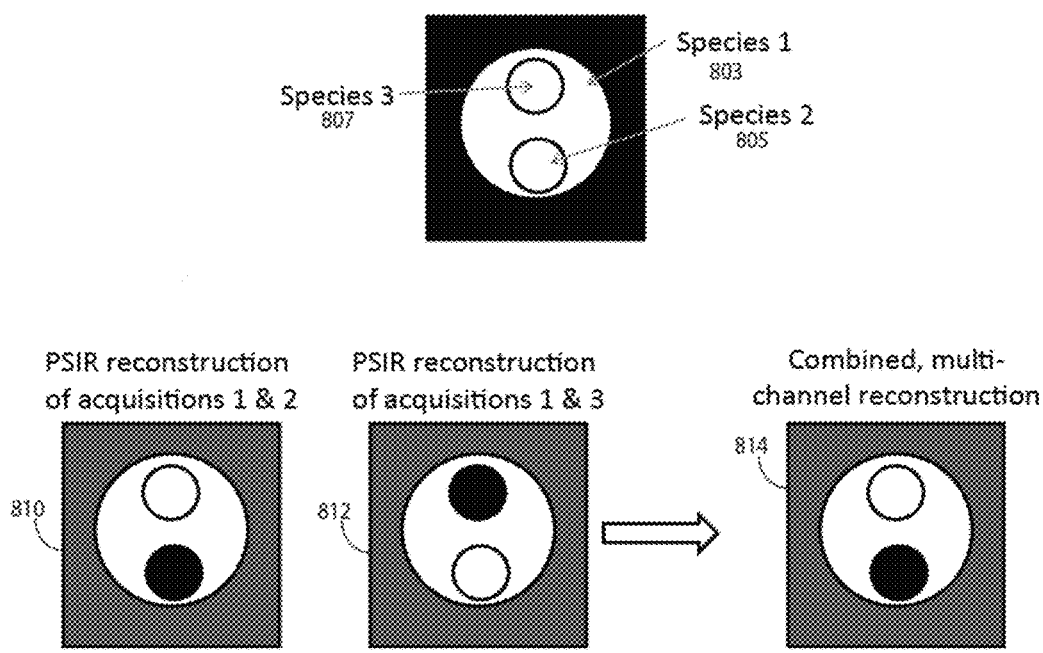
FIG. 8 shows multi-spectral image reconstruction using three different TEs in an anatomical and two reference MR image dataset acquisitions to acquire data in which three different frequencies are separated and combined into a multi-spectral image dataset according to embodiments of the present disclosure.

FIG. 8 shows multi-spectral image reconstruction using separate image data acquired using three different TEs in a conventional MR image data acquisition and two reference MR image data acquisitions. The separate image data comprises anatomical material species 1, 2 and 3 (803, 805, 807) having three corresponding different resonance frequencies which are combined into a multi-spectral image dataset. The system enables resolution of, fat, water and silicone, for example, since each have different resonance frequencies. Image 810 comprises a combination dataset comprising a PSIR reconstruction of acquired image data of anatomical material species 1 (803) and 2 (805). Image 812 comprises a combination dataset comprising a PSIR reconstruction of acquired image data of anatomical material species 1 (803) and 3 (807). Image 814 comprises a combination dataset comprising a multi-channel reconstruction of images 810 and 812.

Figure 9:
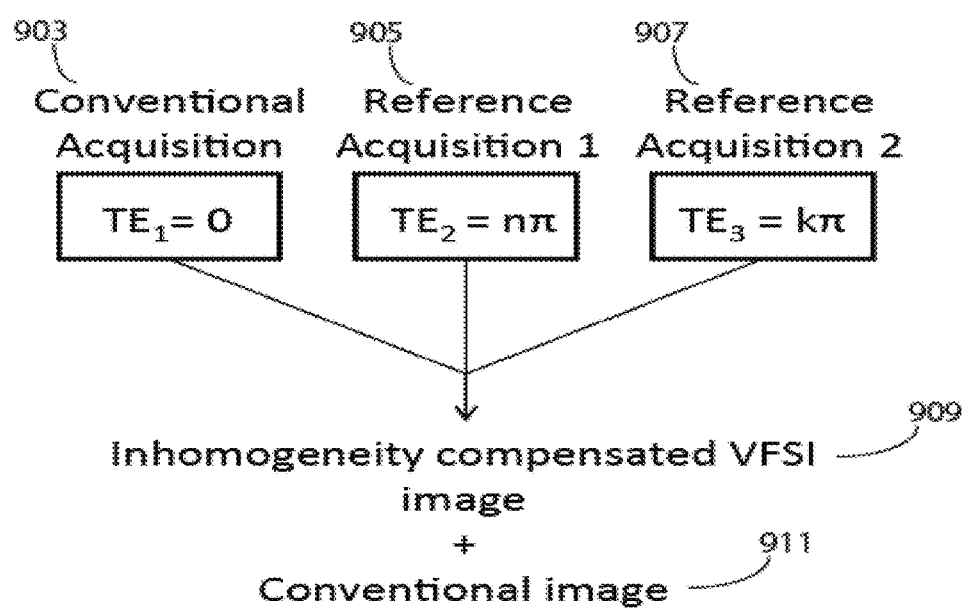
FIG. 9 shows an inhomogeneity compensated virtual frequency selective inversion in which two reference image dataset acquisitions compensate for inhomogeneity in a magnetic field providing a virtual frequency selective inversion according to embodiments of the present disclosure.

FIG. 9 shows an inhomogeneity compensated virtual frequency selective inversion in which two reference image data acquisitions 905 and 907 compensate for inhomogeneity in a magnetic field. Conventional MR image data acquisition 903 and reference image data acquisitions 905 and 907 are combined to provide an inhomogeneity compensated VFSI image 909 and a conventional MR image 911. In this embodiment, instead of resolving three frequencies, the two reference image data acquisitions are used to improve the quality of a virtual inversion of one frequency. In this example, the TEs of the reference scans are set such that two frequencies are more robustly separated in the presence of magnetic field inhomogeneities.

Figure 10:
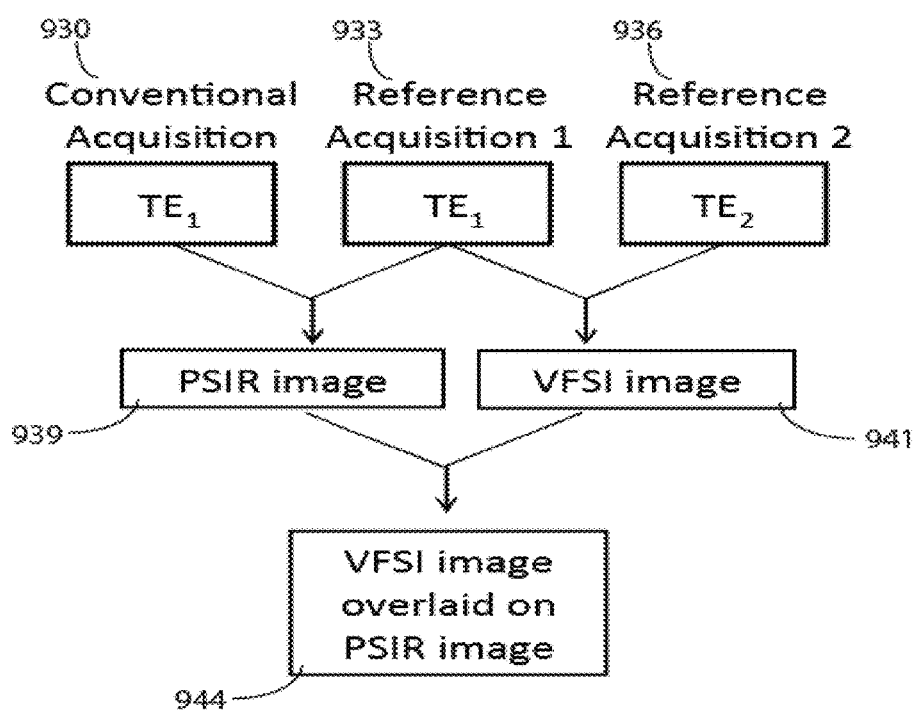
FIG. 10 shows combination of VFSI and known PSIR image data according to embodiments of the present disclosure.

FIG. 10 shows combination of VFSI and PSIR image data. In this example, the echo times of conventional MR image data acquisition 930 and one of the reference image data acquisitions 933 are the same. Second reference image data acquisition 936 employing a different echo time, provides a virtual inversion. Standard PSIR image 939 is generated using conventional acquisition 930 and reference acquisition 933. VFSI image 941 is generated using reference acquisition 933 and second reference acquisition 936. Image 944 is generated by overlaying VFSI image 941 on PSIR image 939. A further embodiment enables the separation of MR signal based on phase change occurring due to magnetization preparation of a conventional MR image data acquisition (for example, after an IR pulse) from the phase change occurring due to a virtual chemical inversion. In this embodiment, the two reference acquisitions 933, 936 have different TEs selected to separate two frequencies (for example, water and fat), and reference acquisition 933 has a TE equal to that of known MR acquisition 930. In this example, an IR pulse provided in the conventional image acquisition 930 to impart T1-weighting, and the two reference acquisitions 933, 936 enable virtual frequency selective inversion. The reconstructed image 939 comprises a PSIR image created by mapping the phase change between the conventional acquisition 930 and the reference acquisition 933 with the same TE, while the two reference acquisitions 933, 936 are used to create an additional channel comprising a frequency selective inversion image 941 which can be overlaid on PSIR image 939 using an independent image intensity scale. Multiple different image configurations can be used, since the system is not limited to only three acquisitions.

Figure 11:
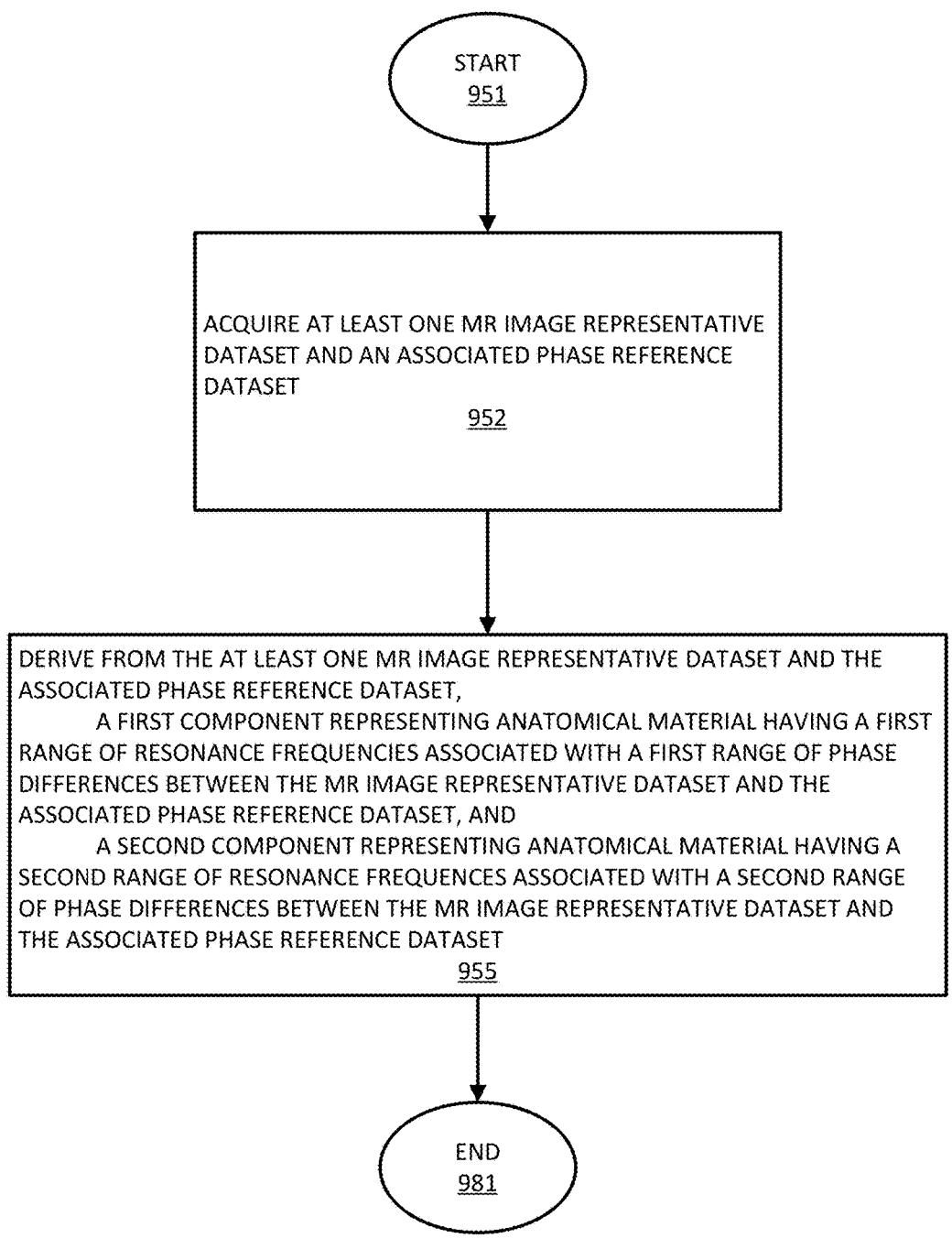
FIG. 11 shows a flowchart of a process performed by a system for processing MRI data employing virtual frequency selective inversion according to embodiments of the present disclosure.

FIG. 11 shows a flowchart of a process performed by system 10 (FIG. 2) for processing MRI data employing virtual frequency selective inversion. In step 952 following the start at step 951 an interface in imaging computer 17 uses the MRI equipment to acquire at least one MR image representative dataset and an associated phase reference dataset where, the at least one MR image representative dataset and reference phase image dataset are 3D datasets, for example. Imaging computer 17 in step 955 derives first and second components from the at least one MR image representative dataset and the associated phase reference dataset. The first component represents anatomical material having a first range of resonance frequencies associated with a first range of phase differences between the MR image representative dataset and the associated phase reference dataset. The second component represents anatomical material having a second range of resonance frequencies associated with a second range of phase differences between the MR image representative dataset and the associated phase reference dataset. The process of FIG. 11 terminates at step 981.

Figure 12:
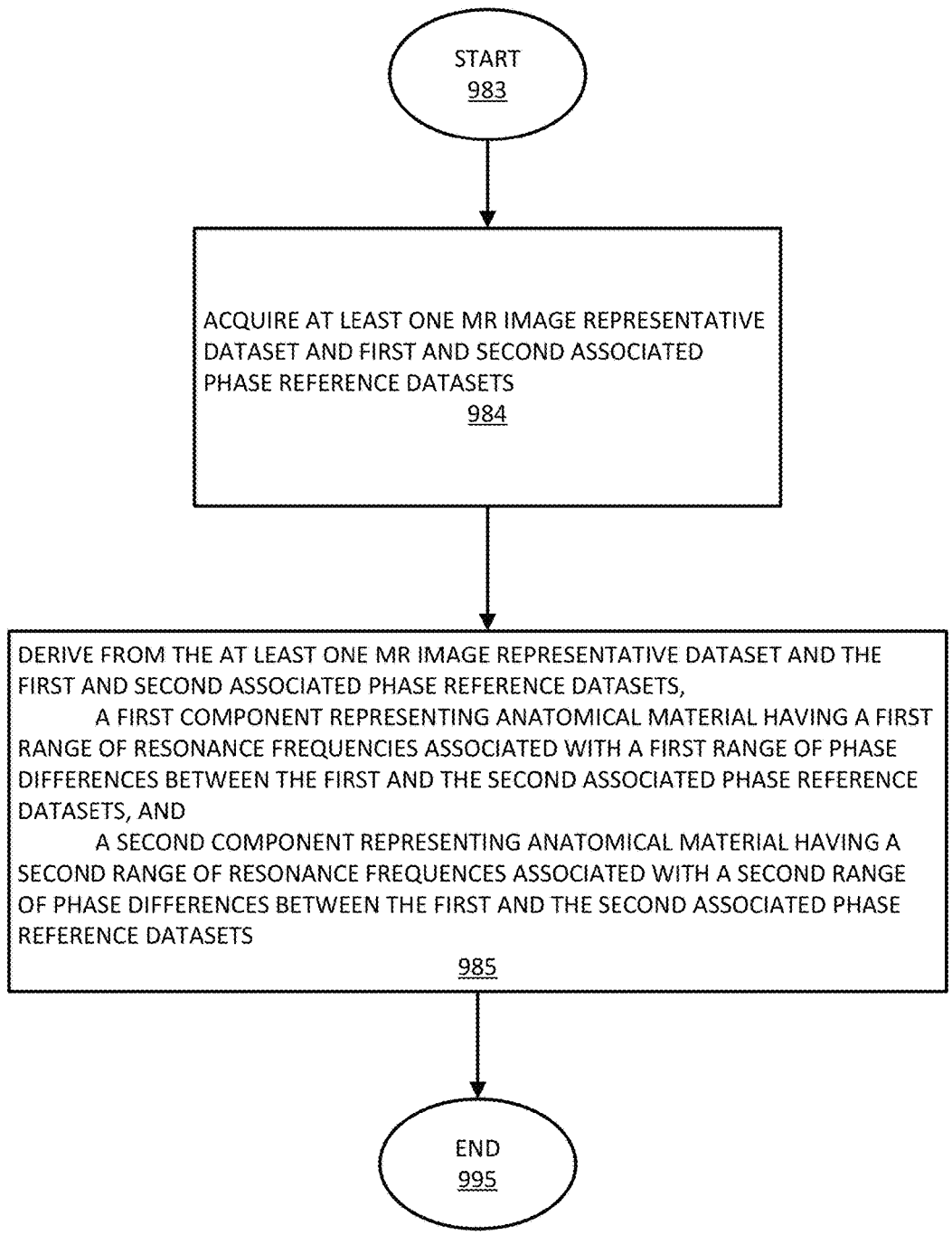
FIG. 12 shows a flowchart of a further process performed by a system for processing MR image phase information datasets employing virtual frequency selective inversion according to embodiments of the present disclosure.

FIG. 12 shows a flowchart of a further process performed by system 10 (FIG. 2) for processing MR image phase information datasets employing virtual frequency selective inversion. In step 984 following the start at step 983 an interface in imaging computer 17 uses the MRI equipment to acquire at least one MR image representative dataset and first and second associated phase reference datasets where the at least one MR image representative dataset and reference phase image datasets are 3D datasets, for example. Imaging computer 17 in step 985 derives from the at least one MR image representative dataset and the first and second associated phase reference datasets, a first component representing anatomical material having a first range of resonance frequencies associated with a first range of phase differences between the first and the second associated phase reference datasets and, a second component representing anatomical material having a second range of resonance frequencies associated with a second range of phase differences between the first and the second associated phase reference datasets. The process of FIG. 12 terminates at step 995.

Returning to FIG. 2, RF coils 4 emit RF pulses to excite nuclear proton spins in a patient on support table 5 in measurement volume M and acquire resultant RF echo signals. The correspondingly obtained magnetic resonance signals are demodulated in receiver processing unit 8 of RF system 22 in a phase-sensitive manner, and are converted via respective analog-digital converters 11 into a real part and an imaginary part of the measurement signal and processed by imaging computer 17. Imaging computer 17 reconstructs an image from the processed acquired RF echo pulse data. The processing of RF data, the image data and the control programs is performed under control of system computer 20. In response to predetermined pulse sequence control programs, sequence controller 18 controls generation of desired pulse sequences and corresponding scanning of k-space. In particular, sequence controller 18 controls the switching of the magnetic gradients at appropriate times, transmission of RF pulses with a determined phase and amplitude and reception of magnetic resonance signals in the form of RF echo data. Synthesizer 19 determines timing of operations of RF system 22 and sequence controller 18. The selection of appropriate control programs for generating an MR image and the display of the generated nuclear spin image is performed by a user via terminal (console) 21, which contains a keyboard and one or more screens.

In one embodiment, RF coils 4 comprise a subset or substantially all of, multiple RF coils arranged in sections along the length of volume M corresponding to the length of a patient. Further, an individual section RF coil of coils 4 comprises multiple RF coils providing RF image data that is used in parallel to generate a single MR image. RF pulse signals are applied to RF coils 4, which in response produces magnetic field pulses which rotate the spins of the protons in the imaged body by ninety degrees or by one hundred and eighty degrees for so-called "spin echo" imaging, or by angles less than or equal to 90 degrees for so-called "gradient echo" imaging. In response to the applied RF pulse signals, RF coils 4 receive MR signals, i.e., signals from the excited protons within the body as they return to an equilibrium position established by the static and gradient magnetic fields. The MR signals comprising nuclear spin echo signals received by RF coils 4 as an alternating field resulting from the processing nuclear spins, are converted into a voltage that is supplied via a radio-frequency amplifier 7 and multiplexer 6 to a radio-frequency receiver processing unit 8 of a radio-frequency system 22.

The radio-frequency system 22 operates in an RF signal transmission mode to excite protons and in a receiving mode to process resulting RF echo signals. In transmission mode, system 22 transmits RF pulses via transmission channel 9 to initiate nuclear magnetic resonance in volume M. Specifically, system 22 processes respective RF echo pulses associated with a pulse sequence used by system computer 20 in conjunction with sequence controller 18 to provide a digitally represented numerical sequence of complex numbers. This numerical sequence is supplied as real and imaginary parts via digital-analog converter 12 in the high-frequency system 22 and from there to a transmission channel 9. In the transmission channel 9, the pulse sequences are modulated with a radio-frequency carrier signal, having a base frequency corresponding to the resonance frequency of the nuclear spins in the measurement volume M. The conversion from transmitting to receiving operation is done via a multiplexer 6. RF coils 4 emit RF pulses to excite nuclear proton spins in measurement volume M and acquire resultant RF echo signals. The correspondingly obtained magnetic resonance signals are demodulated in receiver processing unit 8 of RF system 22 in a phase-sensitive manner, and are converted via respective analog-digital converters 11 into a real part and an imaginary part of the measurement signal and processed by imaging computer 17. Transverse plane inversion occurs in the x or y direction and longitudinal plane inversion occurs in the z plane.

A processor as used herein is a device for executing machine-readable instructions stored on a computer readable medium, for performing tasks and may comprise any one or combination of, hardware and firmware. A processor may also comprise memory storing machine-readable instructions executable for performing tasks. A processor acts upon information by manipulating, analyzing, modifying, converting or transmitting information for use by an executable procedure or an information device, and/or by routing the information to an output device. A processor may use or comprise the capabilities of a computer, controller or microprocessor, for example, and is conditioned using executable instructions to perform special purpose functions not performed by a general purpose computer. A processor may be coupled (electrically and/or as comprising executable components) with any other processor enabling interaction and/or communication there-between. A user interface processor or generator is a known element comprising electronic circuitry or software or a combination of both for generating display images or portions thereof. A user interface comprises one or more display images enabling user interaction with a processor or other device.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters. A graphical user interface (GUI), as used herein, comprises one or more display images, generated by a display processor and enabling user interaction with a processor or other device and associated data acquisition and processing functions.

The UI also includes an executable procedure or executable application. The executable procedure or executable application conditions the display processor to generate signals representing the UI display images. These signals are supplied to a display device which displays the image for viewing by the user. The executable procedure or executable application further receives signals from user input devices, such as a keyboard, mouse, light pen, touch screen or any other means allowing a user to provide data to a processor. The processor, under control of an executable procedure or executable application, manipulates the UI display images in response to signals received from the input devices. In this way, the user interacts with the display image using the input devices, enabling user interaction with the processor or other device. The functions and process steps herein may be performed automatically or wholly or partially in response to user command. An activity (including a step) performed automatically is performed in response to executable instruction or device operation without user direct initiation of the activity.

Definitions

EPI comprises echo planar imaging involves image acquisition whereby a complete image is formed from a single data sample (k-space lines are acquired in one repetition time) of a gradient echo or spin echo sequence.

An inversion recovery (IR) pulse inverts longitudinal magnetization from the positive z-axis by 180 degrees to the negative z-axis. IR pulses are used as preparation pulses prior to a main imaging pulse sequence to achieve different kinds of MR contrast (such as T1 weighted).

iPAT (integrated Parallel Acquisition Techniques) comprises "parallel imaging". It enables faster scanning through reduced phase encoding and addition of RF coil information. An iPAT factor of 2 enables scanning about twice as fast, iPAT factor of 3 enables scanning about three times as fast and so on.

TI comprises inversion time, the time between an inversion recovery pulse and the next RF excitation pulse. TI determines the image luminance contrast.

$T_1$ comprises the longitudinal (or spin-lattice) relaxation time $T_1$ decay constant.

$T_2$ comprises the transverse (or spin-spin) relaxation time $T_2$ is the decay constant for a proton spin component.

TR comprises repetition time, the time between successive RF excitation pulses.

$TR_{ALL}$ comprises a total repetition time comprising multiple individual TR repetition times between successive RF excitation pulses for acquiring a predetermined total number of slices in a diffusion imaging direction using a particular diffusion encoding method.

TE (Echo Time) comprises a time period between the start of an RF pulse and the maximum in the received echo signal. The sequence is repeated every TR seconds.

B0 is the main static base MRI magnetic field.

B1 is the RF transmit coil field.

The system and processes of FIGS. 2-12 are not exclusive. Other systems, processes and menus may be derived in accordance with the principles of the present disclosure to accomplish the same objectives. Although the present disclosure has been described with reference to particular embodiments, it is to be understood that the embodiments and variations shown and described herein are for illustration purposes only. Modifications to the current design may be implemented by those skilled in the art, without departing from the scope of the present disclosure. The system in one embodiment inverts MR signal of selected frequencies without the application of inversion RF pulses, using interleaved acquisitions of a conventional MR image representative dataset and an associated phase reference dataset with different echo times and a phase sensitive reconstruction to provide images in which one chemical species appears to be inverted. Further, the processes and applications may, in alternative embodiments, be located on one or more (e.g., distributed) processing devices on a network linking the units of FIG. 2. Any of the functions and steps provided in FIGS. 2-12 may be implemented in hardware, software or a combination of both.

While the embodiments have been described in connection with the various embodiments of the various figures, it is to be understood that other similar embodiments may be used or modifications and additions may be made to the described embodiment for performing the same function without deviating therefrom. Therefore, the disclosed embodiments should not be limited to any single embodiment, but rather should be construed in breadth and scope in accordance with the appended claims.

What is claimed:

1. A method for acquiring magnetic resonance imaging (MRI) data, the method comprising:
   acquiring an MR image representative dataset,
   interleaving acquisition of an associated phase reference dataset, wherein, the phase reference dataset acquisition employs RF pulses with small flip angles in order to minimize changes in magnetization prior to acquisition of said MR image representative dataset, and wherein the phase reference dataset acquisition employs an echo time different from the echo time used for acquiring said MR image representative dataset; and
   deriving an image using phase sensitive reconstruction from the MR image representative dataset and the associated phase reference dataset with,
      a first component representing anatomical material having a first range of resonance frequencies associated with a first range of phase differences between the MR image representative dataset and the associated phase reference dataset, and
      a second component representing anatomical material having a second range of resonance frequencies associated with a second range of phase differences between the MR image representative dataset and the associated phase reference dataset.

2. The method according to claim 1, wherein the difference in echo times between the MR image representative dataset acquisition and the associated phase reference dataset acquisition is set for virtual frequency selective inversion of fat.

3. The method according to claim 1, wherein the difference in echo times between the MR image representative dataset acquisition and the associated phase reference dataset acquisition is set for virtual frequency selective inversion of water.

4. The method according to claim 1, wherein the difference in echo times between the MR image representative dataset acquisition and the associated phase reference dataset acquisition is set for virtual frequency selective inversion of silicone.

5. The method according to claim 1, wherein the difference in echo times between the MR image representative dataset acquisition and the associated phase reference dataset acquisition is set for virtual frequency selective inversion of a component of water with a specific frequency signature.

6. The method according to claim 1, wherein the difference in echo times between the MR image representative dataset acquisition and the associated phase reference dataset acquisition is set for virtual frequency selective inversion of a component of water shifted in MR frequency following the injection of a contrast agent.

7. The method of claim 1, wherein the conventional MR data acquisition comprises a single shot acquisition using one of a gradient-echo technique, turbo-spin echo (TSE) technique, a steady state free precession (SSFP) technique, and an echo planar imaging (EPI) technique.

8. The method of claim 1, wherein the at least one MR image representative dataset and reference phase image dataset are 3D acquisitions.

9. The method of claim 1, further comprising displaying the image.

10. The method of claim 9, wherein displaying the image comprises displaying voxels associated with a negative phase with a lower image intensity than other displayed voxels.

11. A method for acquiring magnetic resonance imaging (MRI) data, the method comprising:
   acquiring an MR image representative dataset,
   interleaving acquisitions of a first and a second associated phase reference dataset, wherein,
      the first and the second phase reference dataset acquisitions employ RF pulses with small flip angles in order to minimize changes in magnetization prior to acquisition of said MR image representative dataset, and
      the first phase reference dataset acquisition employs an echo time different from the echo time used for acquiring the second phase reference dataset; and
   deriving an image using phase sensitive reconstruction from the MR image representative dataset and the first and second associated phase reference datasets with,
      a first component representing anatomical material having a first range of resonance frequencies associated with a first range of phase differences between the first and the second associated phase reference dataset, and
      a second component representing anatomical material having a second range of resonance frequencies associated with a second range of phase differences between the first and the second associated phase reference dataset.

12. The method according to claim 11, wherein the difference in echo times between the first and the second phase reference dataset acquisitions is set for virtual frequency selective inversion of fat.

13. The method according to claim 11, wherein the difference in echo times between the first and the second phase reference dataset acquisitions is set for virtual frequency selective inversion of water.

14. The method according to claim 11, wherein the difference in echo times between the first and the second phase reference dataset acquisitions is set for virtual frequency selective inversion of silicone.

15. The method according to claim 11, wherein the difference in echo times between the first and the second phase reference dataset acquisitions is set for virtual frequency selective inversion of a component of water with a specific frequency signature.

16. The method according to claim 11, wherein the difference in echo times between the first and the second phase reference dataset acquisitions is set for virtual frequency selective inversion of a component of water shifted in MR frequency following the injection of a contrast agent.

17. The method of claim 11, wherein the conventional MR data acquisition comprises a single shot acquisition using one of a gradient-echo technique, turbo-spin echo (TSE) technique, a steady state free precession (SSFP) technique, and an echo planar imaging (EPI) technique.

18. The method of claim 11, wherein the at least one MR image representative dataset and reference phase image dataset are 3D acquisitions.

19. A system for acquiring MRI data in which MR signal of selected frequencies are inverted without the application of inversion RF pulses for this purpose, the system comprising:
   an interface for acquiring at least one MR image representative dataset and an associated phase reference dataset;

at least one computer configured to:
  derive from the at least one MR image representative dataset and the associated phase reference dataset,
    a first component representing anatomical material having a first range of resonance frequencies associated with a first range of phase differences between the MR image representative dataset and the associated phase reference dataset and,
    a second component representing anatomical material having a second range of resonance frequencies associated with a second range of phase differences between the MR image representative dataset and the associated phase reference dataset.

20. The system of claim 19, wherein the at least one MR image representative dataset and reference phase image dataset are 3D datasets.

\* \* \* \* \*